(12) United States Patent
Liu et al.

(10) Patent No.: US 12,359,963 B2
(45) Date of Patent: Jul. 15, 2025

(54) CONTACT-TYPE VIBRATION PHOTON SENSOR USING DOPPLER EFFECT AND MANUFACTURING METHOD THEREFOR

(71) Applicant: OTN INTELLIGENT TECHNOLOGY (SUZHOU) CO., LTD., Jiangsu Province (CN)

(72) Inventors: Xiaohai Liu, Jiangsu (CN); Yiran Guo, Jiangsu (CN)

(73) Assignee: OTN INTELLIGENT TECHNOLOGY (SUZHOU) CO., LTD, Jiangsu Province (CN)

( * ) Notice: Subject to any disclaimer, the term of this patent is extended or adjusted under 35 U.S.C. 154(b) by 0 days.

(21) Appl. No.: 18/030,564

(22) PCT Filed: Feb. 18, 2022

(86) PCT No.: PCT/CN2022/076865
§ 371 (c)(1),
(2) Date: Apr. 6, 2023

(87) PCT Pub. No.: WO2022/233172
PCT Pub. Date: Nov. 10, 2022

(65) Prior Publication Data
US 2023/0375397 A1    Nov. 23, 2023

(30) Foreign Application Priority Data
May 7, 2021   (CN) .......................... 202110494126.9

(51) Int. Cl.
G01H 9/00     (2006.01)
B81C 1/00     (2006.01)
G01B 9/02     (2022.01)
G01B 9/02003  (2022.01)

(52) U.S. Cl.
CPC ............. *G01H 9/00* (2013.01); *B81C 1/0015* (2013.01); *G01B 9/02003* (2013.01); *G01B 9/02045* (2013.01)

(58) Field of Classification Search
CPC ........ G01H 9/00; G01H 9/009; B81C 1/0015; B81C 1/00134; B81C 1/00015;
(Continued)

(56) References Cited

U.S. PATENT DOCUMENTS 7,282,329 B2 *  10/2007  Manalis .............. B81C 1/00071
                                                    422/68.1
10,240,971 B2 *  3/2019  Wakita ..................... G01H 9/00
(Continued)

FOREIGN PATENT DOCUMENTS

CN      101608944     12/2009
CN      205506859      8/2016
(Continued)

OTHER PUBLICATIONS

International Search Report in PCT/CN2022/076865, mailed Apr. 7, 2022.

*Primary Examiner* — John R Lee
(74) *Attorney, Agent, or Firm* — Wissing Miller LLP

(57) ABSTRACT

The present application relates to a contact-type vibration photon sensor using the Doppler effect and a manufacturing method therefor. A contact-type vibration photon sensor using the Doppler effect includes an outer packaging layer (9), and the outer packaging layer (9) further includes: a silicon-based material (1) and a mirror body (2); the silicon-based material (1) includes side walls (10) and a cavity (11) surrounded by the side walls (10) with a top opening; and the mirror body (2) is arranged inside the cavity (11), a mirror layer (21) is arranged on the top of the mirror body (2), the side surface of the mirror body (2) is connected with the side walls (10) through a cantilever beam (22), and the cantilever
(Continued)

beam (22) is spring-shaped. The contact-type vibration photon sensor provided by the present application utilizes the Doppler effect to provide accurate precision, and uses a spring-shaped cantilever beam, thereby increasing the amplitude of the mirror body (2), and improving the sensitivity of the sensor when sensing vibration.

7 Claims, 8 Drawing Sheets

(58) Field of Classification Search
CPC .. B81C 1/00; G01B 9/02003; G01B 9/02002; G01B 9/02001; G01B 9/02; G01B 9/02045; G01B 9/02041; G01B 9/00; H01L 21/67; H01L 21/70
See application file for complete search history.

(56) References Cited

U.S. PATENT DOCUMENTS

| | | | | |
|---|---|---|---|---|
| 10,684,114 | B2 * | 6/2020 | Li | G01H 9/004 |
| 2005/0064581 | A1 * | 3/2005 | Manalis | G01N 33/54373 |
| | | | | 435/287.2 |
| 2007/0172940 | A9 * | 7/2007 | Manalis | B81B 7/007 |
| | | | | 435/287.2 |
| 2010/0014140 | A1 * | 1/2010 | Akedo | G02B 26/0833 |
| | | | | 359/199.1 |
| 2012/0074818 | A1 * | 3/2012 | Crowley | G01C 21/165 |
| | | | | 310/348 |
| 2015/0177126 | A1 * | 6/2015 | Tamayo De Miguel | |
| | | | | G01B 21/20 |
| | | | | 73/643 |
| 2017/0356792 | A1 * | 12/2017 | Wakita | G01H 9/00 |
| 2019/0271854 | A1 * | 9/2019 | Li | G01N 21/4795 |
| 2023/0375397 | A1 * | 11/2023 | Liu | G01B 9/02003 |
| 2024/0027234 | A1 * | 1/2024 | Liu | G01D 5/268 |

FOREIGN PATENT DOCUMENTS

| | | |
|---|---|---|
| CN | 105953908 | 9/2016 |
| CN | 107490428 | 12/2017 |
| CN | 108663113 | 10/2018 |
| CN | 110220583 | 9/2019 |
| CN | 112903085 | 6/2021 |
| JP | 0972780 | 3/1997 |
| JP | 2012103068 | 5/2012 |

* cited by examiner

CONTACT-TYPE VIBRATION PHOTON SENSOR USING DOPPLER EFFECT AND MANUFACTURING METHOD THEREFOR

CROSS-REFERENCE TO RELATED APPLICATIONS

The present application claims the benefit of priority to Chinese Patent Application No. CN2021104941269 filed on Dec. 21, 2022, which is incorporated herein by reference in its entirety.

TECHNICAL FIELD

The present application belongs to the technical field of photonic chips, and particularly relates to a contact-type vibration photon sensor using the Doppler effect and a manufacturing method therefor.

BACKGROUND

As the third revolution in the information technology industry, the Internet of Things (IOT) requires the interconnection of everything through various information sensors. In selecting an interconnection mode, all-optical network becomes a better solution than the traditional cable network, because the all-optical network can realize the network transmission and exchange process through optical fibers without the need for realizing photo-electric conversion and electro-optical conversion, the advantages of greatly improving the network speed and reliability are thus achieved. In the all-optical network, piezoelectric, capacitive, piezoresistive and other traditional sensors, when being accessed, have disadvantages such as bandwidth limitation, clock skew, severe crosstalk, and high power consumption. Therefore, a sensor capable of detecting vibrations upon the principles of optics becomes the best choice.

Currently, two kinds of technologies are chiefly used for measuring vibrations upon the principles of optics, one is the optical fiber vibration sensing technology, and the other is the laser Doppler vibration measurement technology.

According to the modulated type, the optical fiber vibration sensing technology can be divided into intensity-modulated type, phase-modulated type, wavelength-modulated type, polarization state-modulated type and mode-modulated type. Currently, intensity-modulated type and wavelength-modulated type are the most common products available on the market. Basic principle of the intensity-modulated type optical fiber vibration sensor is that vibrations of an object to be measured causes the change of the light intensity of transmitted light in an optical fiber, and vibrations of the object are thus measured by detecting the change of the light intensity. This type of sensors has the advantages of simple structure, low cost and easy implementation, so it is developed and applied earlier. However, due to the limitations of the principle, these sensors are easily affected by light source fluctuation, connector loss and the like, and the detected light intensity is greatly affected by an optical path and the environment, so they can only be applied to occasions with low accuracy requirements and few interference sources. Basic principle of the wavelength-modulated type optical fiber vibration sensor is that an object to be measured acts directly or indirectly on the sensitive fiber, causing the wavelength of the transmitted light in the fiber to change, so that vibrations are detected by measuring the change of the wavelength of the transmitted light. At present, the wavelength-modulated optical fiber vibration sensor adopts the fiber Bragg-grating structure, in which the optical fiber containing the Bragg grating is fixed on a cantilever beam, vibrations of an object to be measured causes vibrations of the cantilever beam, which drives the grating to produce periodic stretching or shrinking, thereby results in changes in the wavelength of the transmitted light to measure the vibrations. This type of sensors has the advantages of anti-electromagnetic interference, long-distance transmission and reusability, but it has the disadvantages that the system measurement accuracy is constrained by the spatial resolution, the detection signal is weak, and a very high signal-to-noise ratio is required.

The laser Doppler vibration measurement technology is a measurement technology that uses the laser Doppler effect, optical heterodyne interference and other principles to measure vibrations of an object. Thanks to the advantages of high accuracy, no contact, large dynamic range and the like, the existing laser Doppler vibration measurement technology is cutting-edge featuring great development potential and application prospects in the field of vibration measurement. However, this technology still faces some shortcomings unsolved yet, such as speckle noise, difficulty in measuring objects insensitive to laser reflection, and a section of the optical path exposed to the external environment, which is greatly affected by the environment. Speckle noise refers to the different speckle characteristics formed by scattering of the laser from the surface of different roughness due to the diversity of target surface roughness, and the existence of speckles further affects the measurement of the carrier-to-noise ratio.

SUMMARY

In order to solve technical problems and overcome defects in the prior art, the present application provides a contact-type vibration photon sensor using the Doppler effect and a manufacturing method therefor.

A technical solution adopted by the present application for solving the technical problem above is as follows:

a contact-type vibration photon sensor using the Doppler effect, including an outer packaging layer, where the outer packaging layer further includes:
  a silicon-based material, including side walls and a cavity surrounded by the side walls with a top opening; and
  a mirror body being arranged inside the cavity, where a mirror layer is arranged on the top of the mirror body, the side surface of the mirror body is connected with the side walls through a cantilever beam, and the cantilever beam is spring-shaped.

Preferably, in the contact-type vibration photon sensor using the Doppler effect of the present application, the mirror body is an axisymmetric cylinder with at least two parallel sides.

Preferably, in the contact-type vibration photon sensor using the Doppler effect of the present application, when the mirror body is in the shape of a cube, two opposite sides are connected to the side walls through cantilever beams, or four sides are all connected to the side walls through the cantilever beam.

Preferably, in the contact-type vibration photon sensor using the Doppler effect of the present application, the cantilever beam is provided with grooves that are vertical to the mirror layer and that have different opening directions, and the projections of the two grooves on the plane where the mirror layer is located are arranged in a staggered mode.

Preferably, in the contact-type vibration photon sensor using the Doppler effect of the present application, the cantilever beam has grooves that are parallel to the mirror layer and that have different opening directions, and a central axis of a connection between the cantilever beam and the mirror body is collinear with a central axis of the mirror body.

Preferably, in the contact-type vibration photon sensor using the Doppler effect of the present application, the thickness of the cantilever beam is greater on the side away from the mirror body than on the side close to the mirror body.

The present application further provides a manufacturing method for a contact-type vibration photon sensor using the Doppler effect, including the following steps:

S1: taking an SOI wafer, the SOI wafer includes a base layer, a top layer and an oxide layer between the base layer and the top layer, and the mirror layer is plated on the upper surface of the top layer;

S2: etching the part of the top layer without the cantilever beam from top to bottom to the oxide layer to form an upper cavity, and etching the top end of the cantilever beam to form a spring-shaped groove with a middle opening upward;

S3: etching the base layer from bottom to top to the oxide layer to form a lower cavity;

S4: etching the oxide layer to make the upper cavity and the lower cavity communicated to form a cavity;

S5: etching and thinning the cantilever beam from bottom to top to form a spring-shaped groove with a middle opening upward; and S6: packing the etched SOI wafer to form a contact-type vibration photon sensor using the Doppler effect.

Preferably, for the manufacturing method for a contact-type vibration photon sensor using the Doppler effect of the present application, after Step S5, a bottom silicon-based material is used and bonded to the bottom of the base layer by means of bonding to close the opening at the bottom of the base layer.

Preferably, for the manufacturing method for a contact-type vibration photon sensor using the Doppler effect of the present application, the silicon-based material is bonded to the bottom of the base layer by means of bonding with BCB adhesive.

The present application further provides a manufacturing method for a contact-type vibration photon sensor using the Doppler effect, including the following steps:

S1: taking an SOI wafer, the SOI wafer includes a base layer, a top layer and an oxide layer between the base layer and the top layer, and the mirror layer is plated on the upper surface of the top layer;

S2: etching the part of the top layer without the cantilever beam from top to bottom to the oxide layer to form an upper cavity, etching the top end of the cantilever beam to form a spring-shaped groove parallel to the mirror layer, and making the cantilever beam form the required thickness;

S3: etching the base layer from bottom to top to the oxide layer to form a lower cavity;

S4: etching the oxide layer to make the upper cavity and the lower cavity communicated to form a cavity; and S5: packing the etched SOI wafer to form a contact-type vibration photon sensor using the Doppler effect.

The present application has the beneficial effects:

Compared with the intensity-modulated products in optical fiber vibration sensing, the sensor structure of the present application chiefly overcomes the high dependence on the accuracy and stability of the optical path structure. The sensor structure of the present application uses the Doppler effect as a vibration measurement principle, and the target vibration information is deduced through the frequency information of the reflected light. Compared with the traditional light intensity modulation, the sensor structure of the present application does not require precise alignment and high stability of an optical path and high stability, so as to ensure the light intensity changes of the reflected light are caused by vibrations, rather than are influenced by other factors such as optical path. Because of the above factors, the sensor structure of the present application has higher accuracy compared with the intensity-modulated products in optical fiber vibration sensing.

Compared with the wavelength-modulated products, namely the optical fiber grating, in optical fiber vibration sensing, the sensor structure of the present application chiefly overcomes the defects that the detection signal is weak, and a very high signal-to-noise ratio is required. The Bragg-grating used by the fiber grating itself is a semi-transparent semi-reflective interface, which cannot achieve total transmission or total reflection, so that the light is attenuated when passing through the Bragg grating, resulting in a weak detection signal. The sensor structure of the present application adopts a gold-plated reflector, which has a very high reflectivity, thus greatly reducing the attenuation of light, enhancing the detection signal, and lowering the requirement for signal-to-noise ratio.

Compared with the laser Doppler vibration measurement products, the sensor structure of the present application chiefly solves the influence of speckle noise. In the laser Doppler vibration measurement products, the measurement light directly irradiates on the surface of a measured object, because the measured object is diversified in the surface roughness, so that different speckle characteristics form by scattering of the laser from the surface of different roughness, and the existence of speckles further affects the measurement of the carrier-to-noise ratio. However, the measuring optical fiber of sensor structure of the present application directly irradiates on the surface of the gold-plated reflector to generate a mirror reflection, thereby eliminating the speckle noise. Meanwhile, since the elasticity of the silicon material itself is limited, the use of a spring-shaped cantilever beam can increase the amplitude of the mirror body and improve the sensitivity of the sensor when sensing vibration.

BRIEF DESCRIPTION OF THE DRAWINGS

The technical solution of the present application will be further described below with reference to the accompanying drawings and the embodiments.

Figure 1:
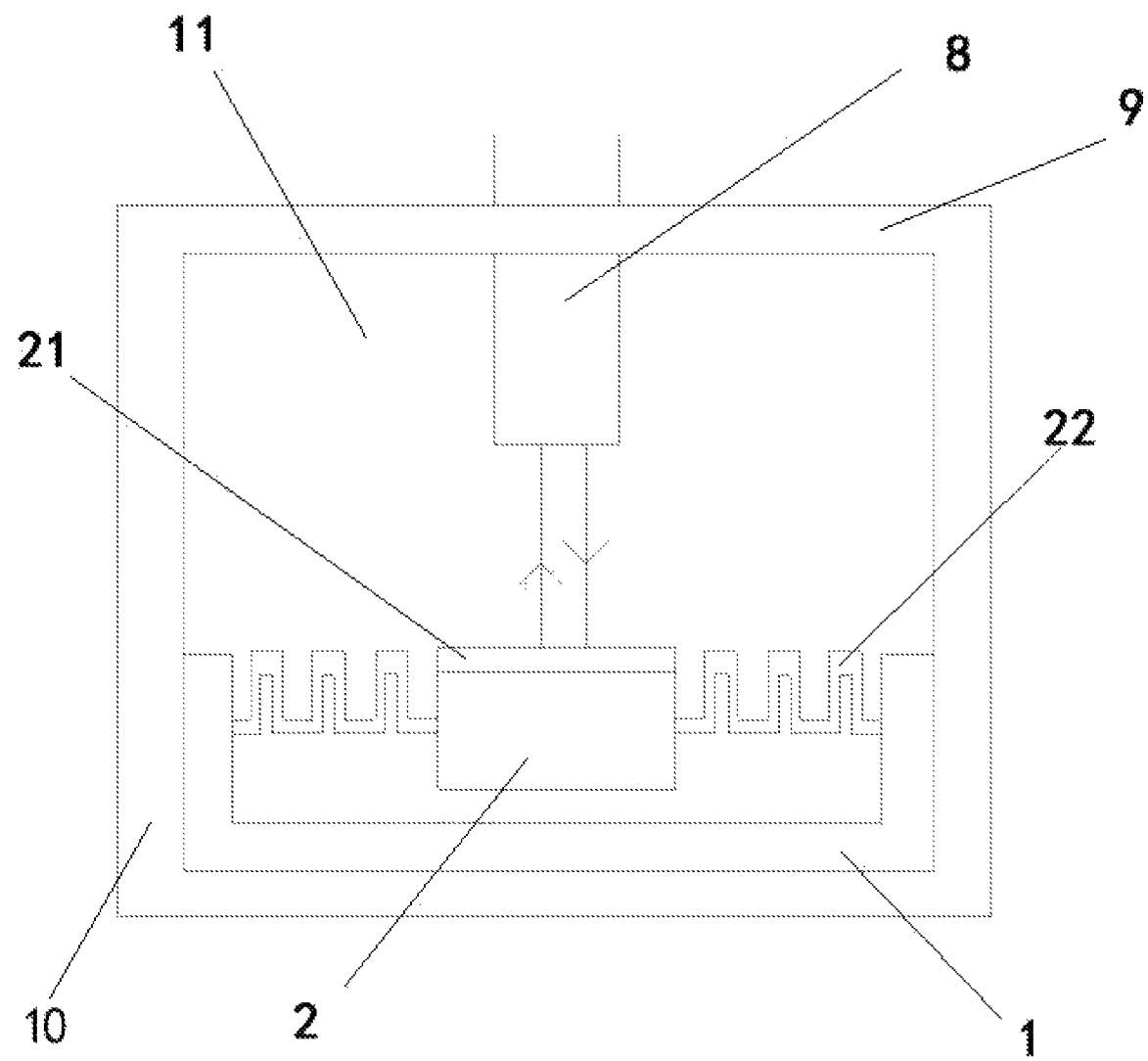
FIG. 1 is a side sectional view of a contact-type vibration photon sensor using the Doppler effect in Embodiment 1 of the present application.
Figure 2:
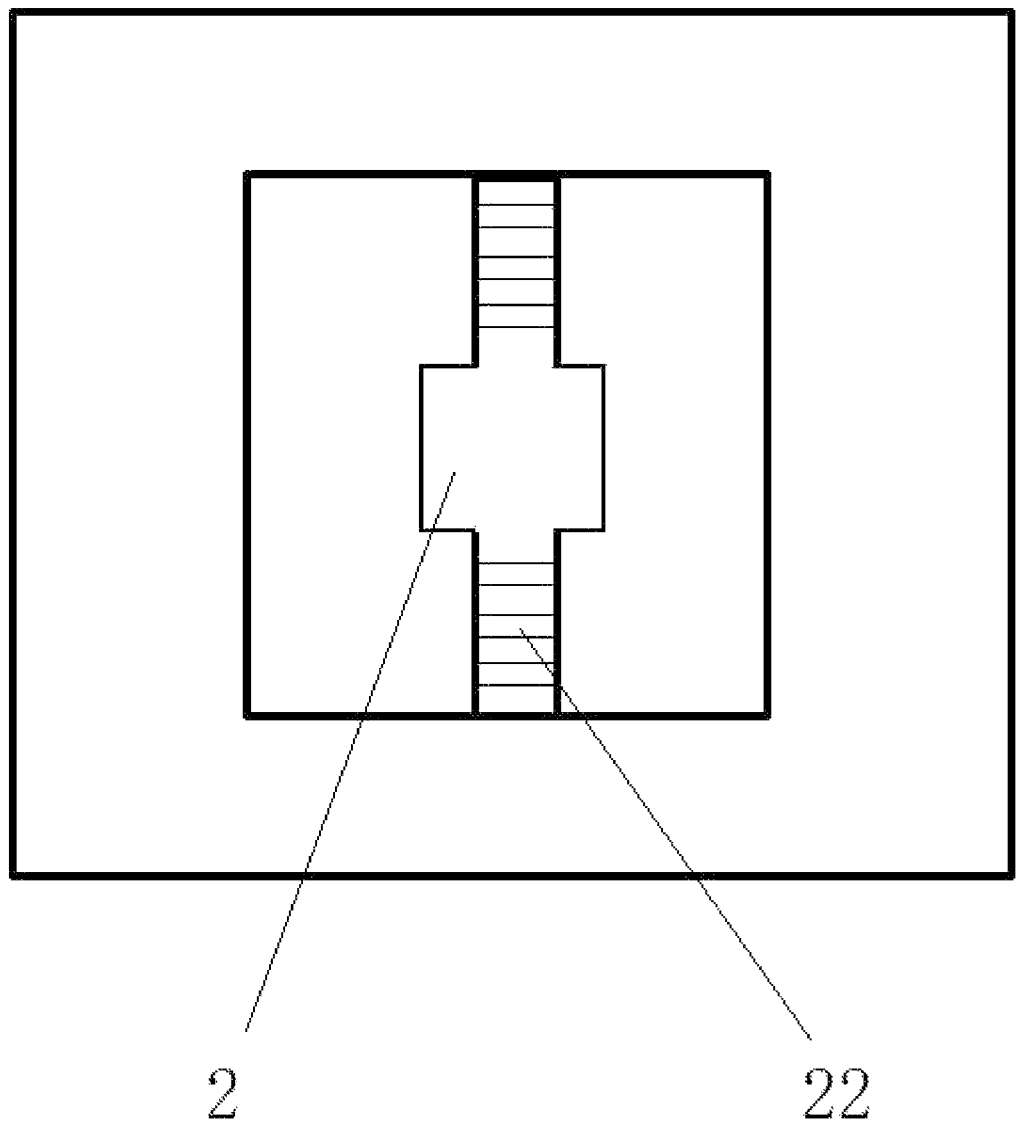
FIG. 2 is a top sectional view of a contact-type vibration photon sensor using the Doppler effect in Embodiment 1 of the present application.
Figure 3:
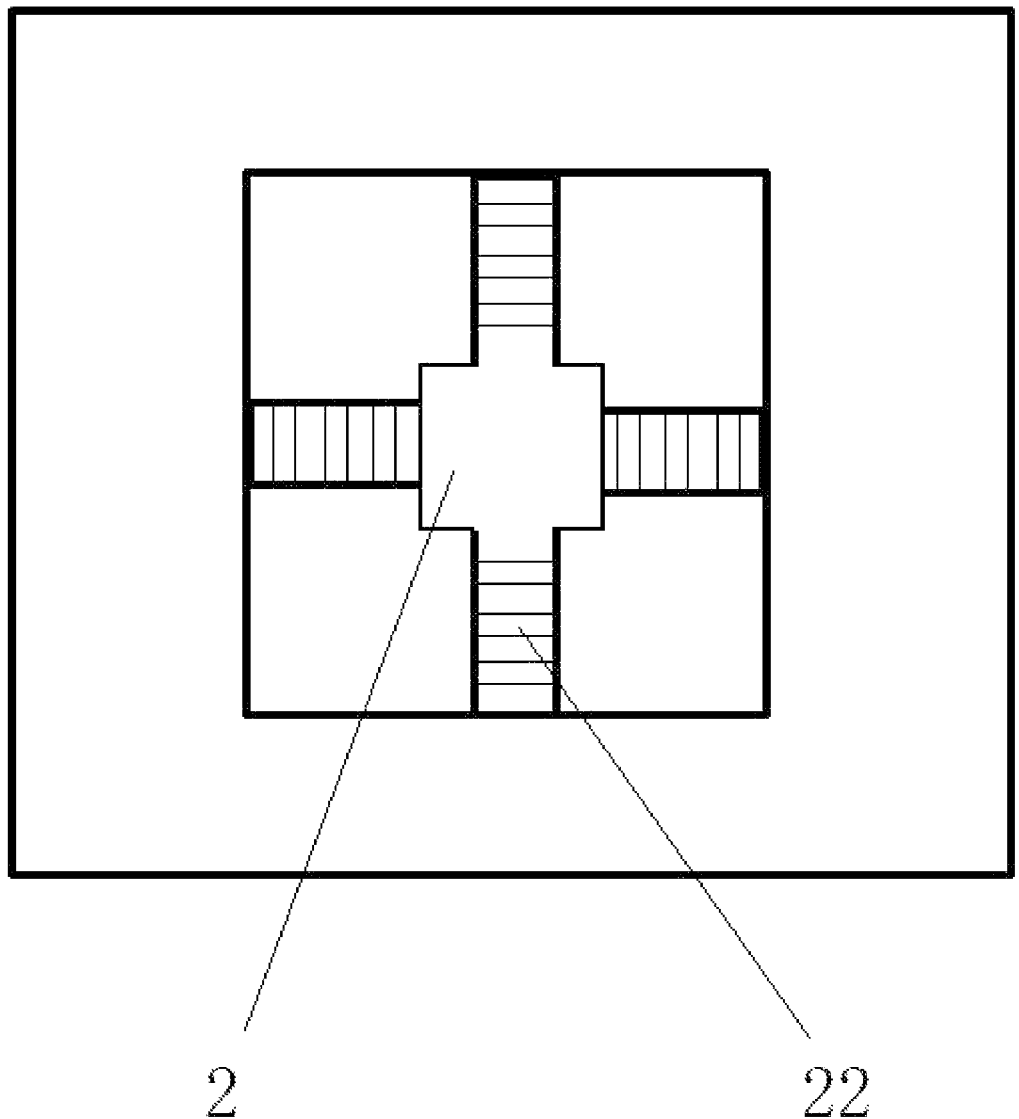
FIG. 3 is a top sectional view of another implementation of a contact-type vibration photon sensor using the Doppler effect in Embodiment 1 of the present application.

Reference numerals in the figures: 1. silicon-based material; 2. mirror body; 8. optical fiber; 9. outer packaging layer; 10. side wall; 11. cavity; 21. mirror layer; 22. cantilever beam; 31. base layer; 32. oxide layer; 33. top layer; and 34. bottom silicon-based material.

DETAILED DESCRIPTIONS OF THE EMBODIMENTS

It should be noted that the embodiments in the present application and features in the embodiments can be combined without conflicts.

The technical solution of the present application will be described in detail below with reference to the accompanying drawings and in conjunction with embodiments

Embodiment 1

The present embodiment provides a contact-type vibration photon sensor using the Doppler effect, including an outer packaging layer 9, as shown in FIG. 1, and the outer packaging layer 9 further includes:

- a silicon-based material 1, including side walls 10 and a cavity 11 surrounded by the side walls 10 with a top opening;
- a mirror body 2 being arranged inside the cavity 11, where a mirror layer 21 is arranged on the top of the mirror body 2, the side surface of the mirror body 2 is connected with the side walls 10 through a cantilever beam 22, and the cantilever beam 22 is spring-shaped (namely, the cantilever beam 22 is provided with grooves that are vertical to the mirror layer 21 and that have different opening directions, and the projections of the two grooves on the plane where the mirror layer 21 is located are arranged in a staggered mode).

The mirror body 2 may be in the shape of a cube, or a cylinder with at least two parallel sides.

When the mirror body 2 is in the shape of a cube, two opposite sides are connected to the side walls 10 through cantilever beams 22, or four sides are all connected to the side walls 10 through the cantilever beam 22.

Since the elasticity of the silicon material itself is limited, the use of a spring-shaped cantilever beam can increase the amplitude of the mirror body 2 and improve the sensitivity of the sensor when sensing vibration.

Embodiment 2

Figure 4:
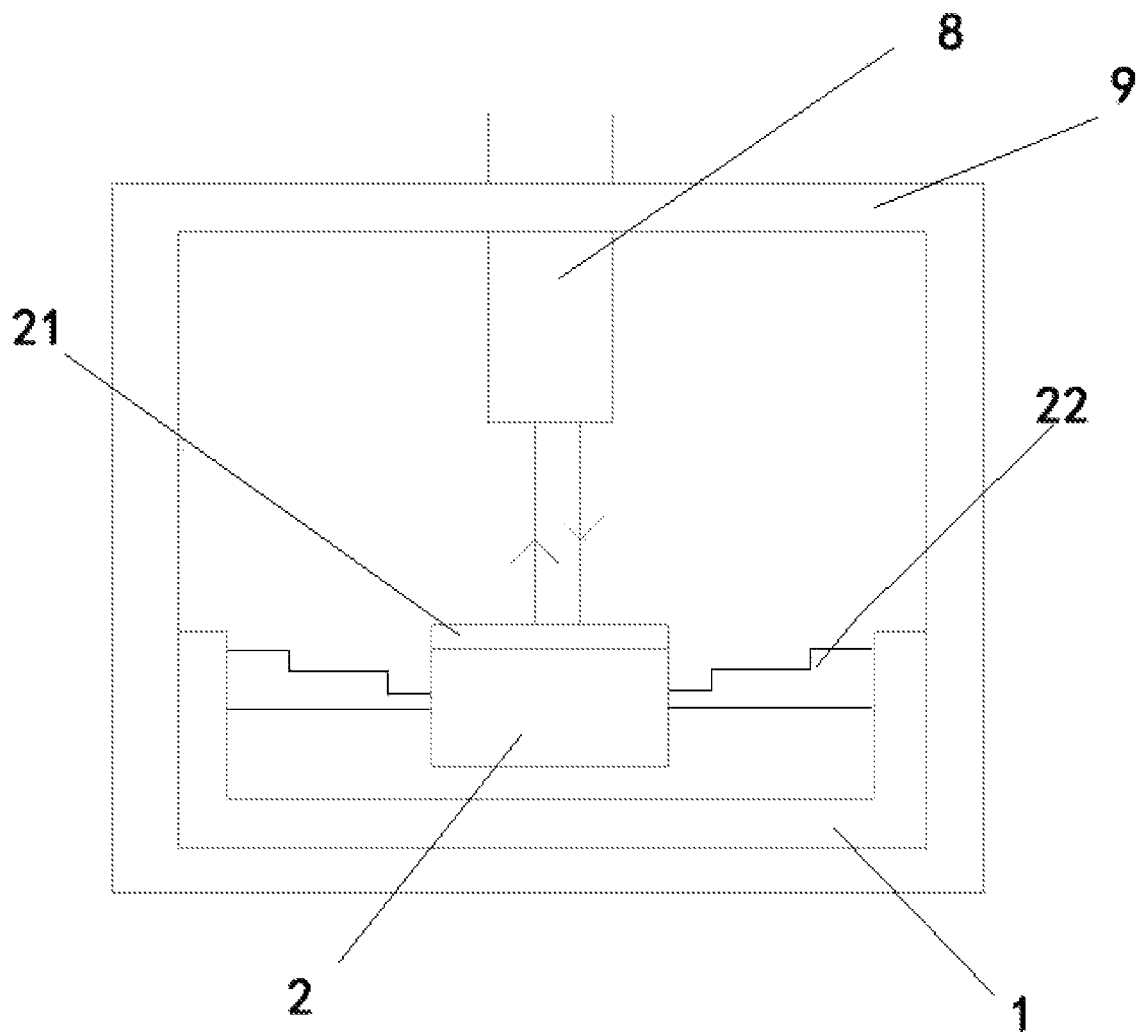
FIG. 4 is a side sectional view of a contact-type vibration photon sensor using the Doppler effect in Embodiment 2 of the present application.
Figure 5:
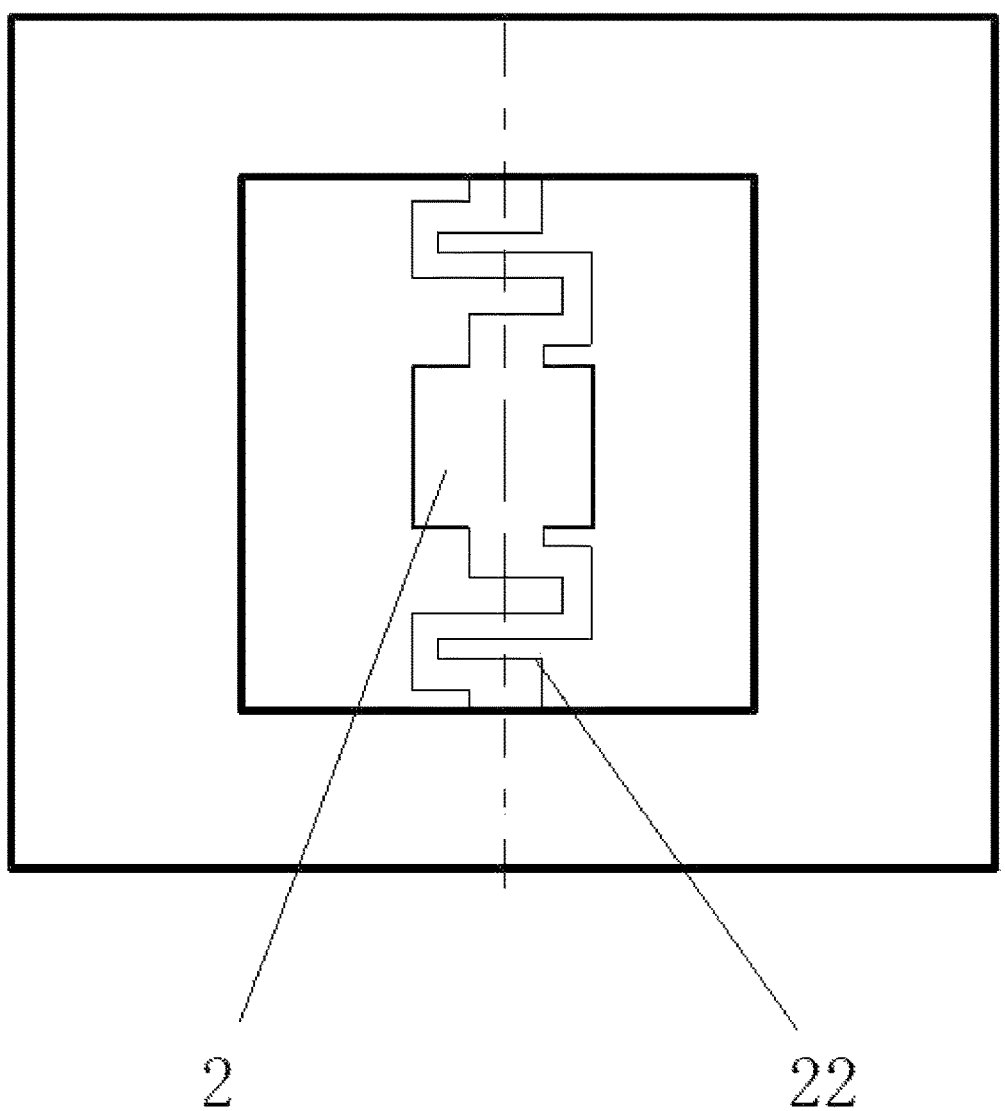
FIG. 5 is a top sectional view of a contact-type vibration photon sensor using the Doppler effect in Embodiment 2 of the present application.

The present embodiment provides a contact-type vibration photon sensor using the Doppler effect, including an outer packaging layer 9, as shown in FIGS. 4 and 5, and the outer packaging layer 9 further includes:

- a silicon-based material 1, including side walls 10 and a cavity 11 surrounded by the side walls 10 with a top opening;
- a mirror body 2 being arranged inside the cavity 11, where a mirror layer 21 is arranged on the top of the mirror body 2, the side surface of the mirror body 2 is connected with the side walls 10 through a cantilever beam 22, and the cantilever beam 22 is spring-shaped; and
- the mirror body 2 may be in the shape of a cube, or a cylinder with at least two parallel sides.

The cantilever beam 22 has grooves that are parallel to the mirror layer 21 and that have different opening directions, a central axis of a connection between the cantilever beam 22 and the mirror body 2 is collinear with a central axis of the mirror body 2, as shown by a dotted line in FIG. 5; and the collinear setting of the central axis can make the mirror body 2 vibration direction fixed, so that the angle of light reflection can be kept consistent.

Further, the thickness of the cantilever beam 22 is greater on the side away from the mirror body 2 than on the side close to the mirror body 2, so that the center of mass of the whole cantilever beam 22 is biased towards the position of the silicon-based material 1, which improves the structural strength without affecting the amplitude. As shown in FIG. 4, a stepped structure with three sections of decreasing thickness is formed.

The detection of vibrations by the sensor structures in the two embodiments above is based on the Doppler effect, which indicates that the receiving frequency of waves becomes higher when the wave source moves toward the observer, while the receiving frequency of waves becomes lower when the wave source moves away from the observer. The physical principle lies in the fact that the reflected light from a moving object will have the vibration characteristics of the moving object itself, that is, the Doppler frequency shift.

$$\Delta f_D = \frac{2Vf}{c} = \frac{2V}{\lambda}$$

in the formula, $\Delta f_D$ represents the Doppler frequency shift of the laser light after reflection from a vibrating object, V is the velocity of the object, and $\lambda$ is the laser wavelength. It can be seen that the principle is to determine the vibration velocity V of the measuring point based on measuring the Doppler frequency $\Delta f_D$ of the coherent laser light wave reflected from the tiny area on the surface of the object, and then the information reflecting the vibration characteristics of the object itself, such as the motion direction, the motion amplitude (namely, the magnitude of d displacement), the motion frequency and the like of the measuring point is obtained.

The sensor in the present application may use an MEMS package structure. An optical fiber 8 is accessed from the outside, and the access end of the optical fiber 8 is fixed in a V-shaped groove made by the MEMS technology to ensure the collimation of the optical path. The mirror body 2 made of silicon is provided directly below the optical fiber 8, and a layer of gold film is plated on the upper surface of the mirror body 2 to make the mirror layer 21 (reflector). The left and right sides of the mirror body 2 are cantilever beams 22 made by the MEMS technology, one end of each cantilever beam 22 is connected with the mirror body 2, and the other end is connected with a "concave" silicon substrate.

The whole structure is a typical MEMS structure. The MEMS structure part and the optical fiber access part are packaged in a cuboid cavity by the packaging technology.

The principle that the sensor structure of the present application conducts vibration detection is that: the sensor of the present embodiment is fixed on the surface of the object to be measured, and when the object to be measured vibrates, the structure vibrates together with the object to be measured because the structure is relatively stationary to the object to be measured. The mirror body 2 inside the cavity 11 remains stationary due to inertia, therefore, a relative velocity is generated between the mirror body 2 and the cavity 11 (including the accessed optical fiber). A laser beam with a fixed frequency f shoots vertically to the cantilever beam 22 through the optical fiber, which is reflected by the mirror layer 21 (reflector) made of gold film on the upper surface of the cantilever beam 22 and then returned to the optical fiber. Since there is a relative velocity between the cantilever beam 22 and the optical fiber 8, the frequency of the reflected light becomes $f+\Delta f_D$ due to the Doppler effect. By analyzing and processing the reflected light with changed frequency, the vibration velocity V of the measuring point is determined, and then the information reflecting the vibration characteristics of the object itself, such as the motion direction, the motion amplitude (namely, the magnitude of d displacement), the motion frequency and the like of the measuring point is obtained.

Embodiment 3

Figure 6:
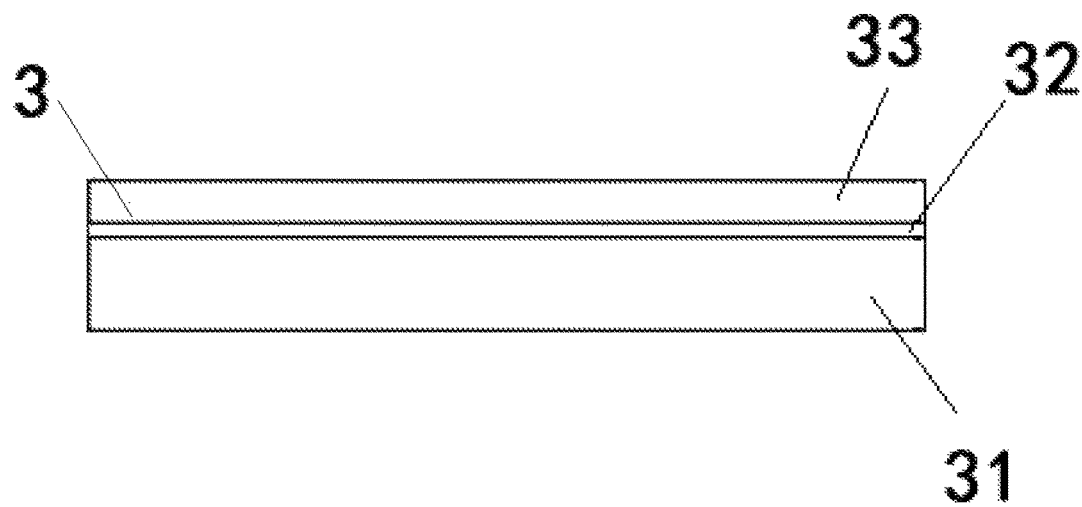
FIG. 6 is a schematic structural diagram of an SOI wafer in a manufacturing method for a contact-type vibration photon sensor using the Doppler effect in Embodiment 3.
Figure 7:
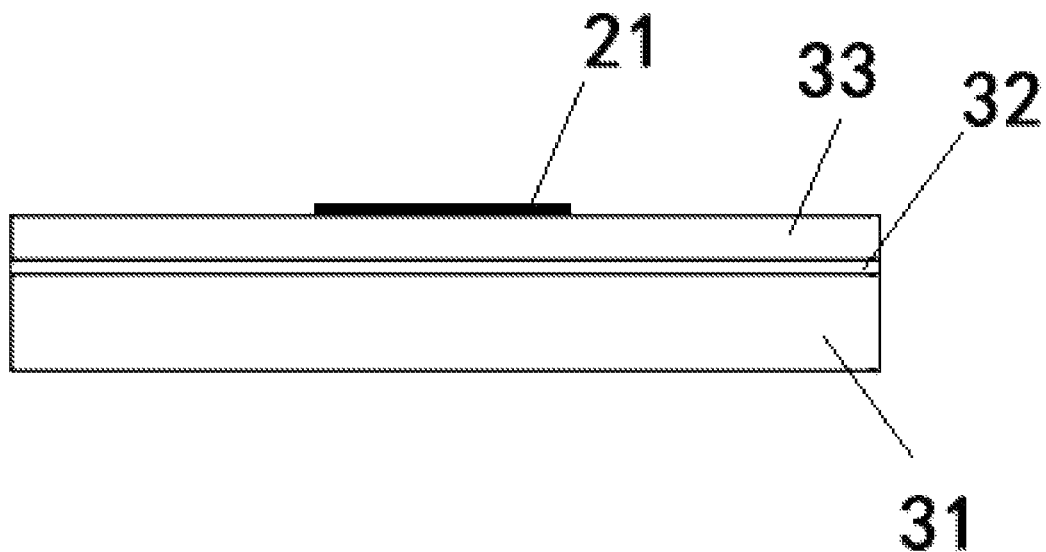
FIG. 7 is a schematic structural diagram of an SOI wafer after plating of a mirror layer in Embodiment 3.
Figure 8:
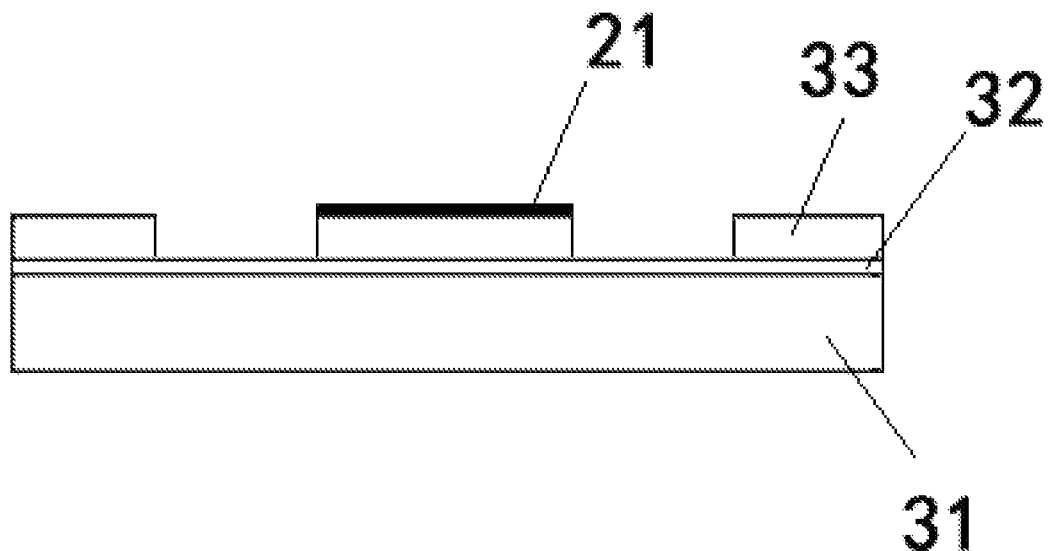
FIG. 8 is a schematic structural diagram of an SOI wafer after top-plating etching in Embodiment 3.
Figure 9:
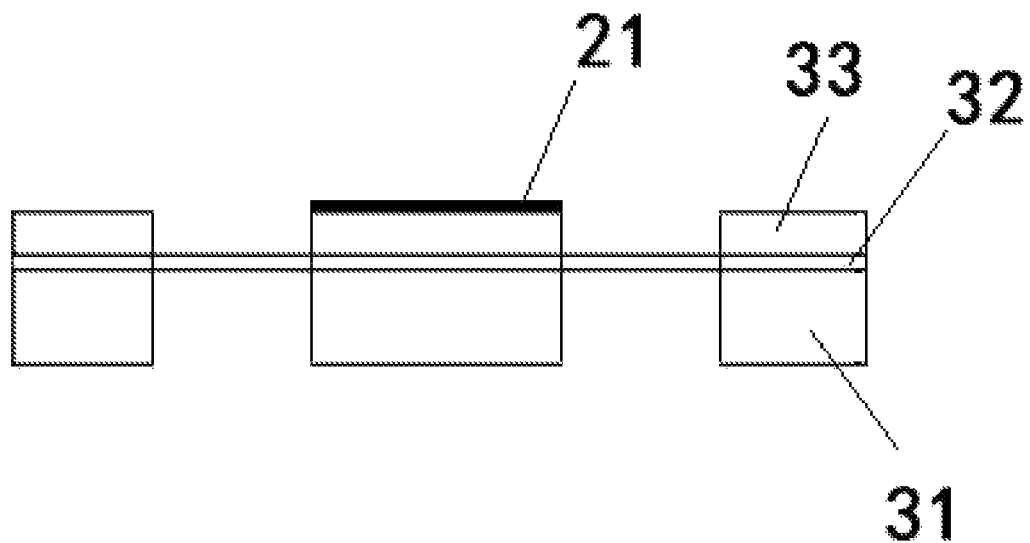
FIG. 9 is a schematic structural diagram of an SOI wafer after bottom-plating etching in Embodiment 3.
Figure 10:
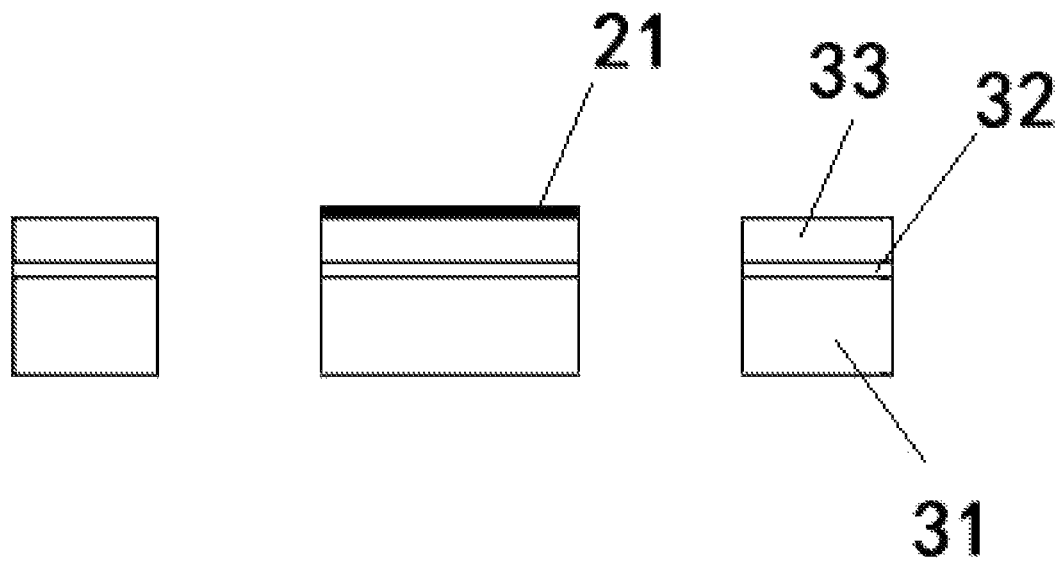
FIG. 10 is a schematic structural diagram of an SOI wafer after etching of the oxide layer in Embodiment 3.

The present embodiment provides a manufacturing method for a contact-type vibration photon sensor using the Doppler effect, which corresponds to the structure of Embodiment 1 and includes the following steps:
   S1: an SOI wafer is taken, and the structure of the same is shown in FIG. 6, where the SOI wafer includes a base layer 31, a top layer 33 and an oxide layer 32 between the base layer 31 and the top layer 33, and the mirror layer 21 is plated on the upper surface of the top layer 33, as shown in FIG. 7;
   S2: the part of the top layer 33 without the cantilever beam 22 is etched from top to bottom to the oxide layer 32 to form an upper cavity, and the top end of the cantilever beam 22 is etched to form a spring-shaped groove with a middle opening upward, as shown in FIG. 8,
   S3: the base layer 31 is etched from bottom to top until to the oxide layer 32 to form a lower cavity, as shown in FIG. 9;
   S4: the oxide layer 32 is etched to make the upper cavity and the lower cavity communicated to form a cavity 11 (the mirror body 2 and the bottom of the cantilever beam 22 are exposed), as shown in FIG. 10;
   S5: the cantilever beam 22 is etched for thinning from bottom to top to form a spring-shaped groove with a middle opening upward; and
   S6: the etched SOI wafer is packed to form a contact-type vibration photon sensor using the Doppler effect in Embodiment 1.

Figure 11:
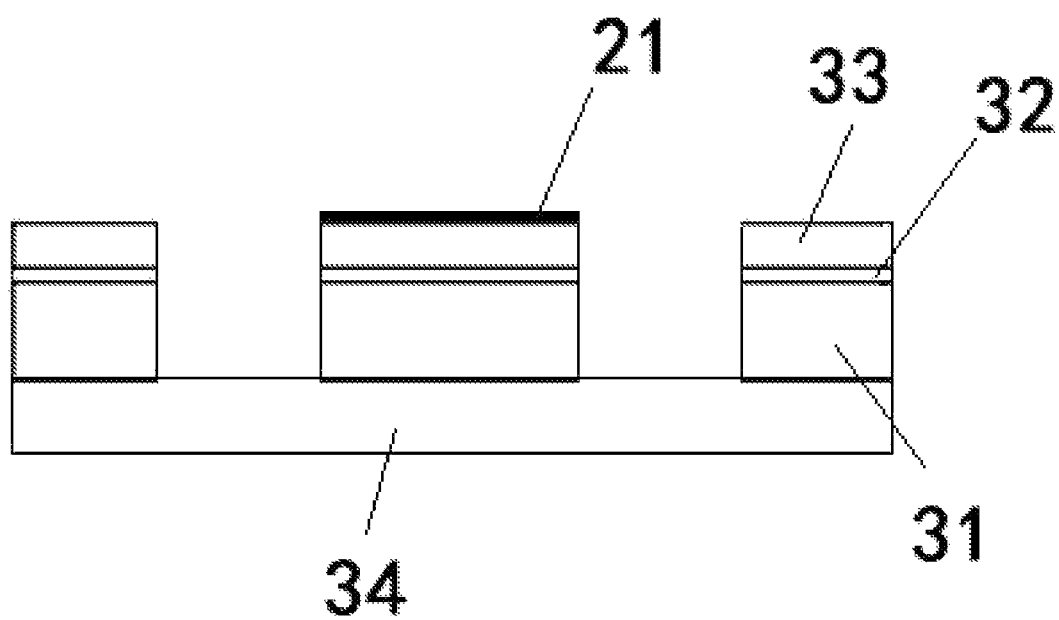
FIG. 11 is a schematic structural diagram of an SOI wafer after being bonded to the silicon-based material in Embodiment 3.

When the bottom opening of the base layer 31 needs to be closed, after Step S5, a bottom silicon-based material 34 can be introduced, and the silicon-based material 34 may be bonded to the bottom contact portion of the base layer 31 by means of bonding with BCB adhesive, thereby closing the bottom opening, as shown in FIG. 11.

Embodiment 4

The present embodiment provides a manufacturing method for a contact-type vibration photon sensor using the Doppler effect, which corresponds to the structure of the Embodiment 2 and includes the following steps:
   S1: an SOI wafer is taken, where the SOI wafer includes a base layer 31, a top layer 33 and an oxide layer 32 between the base layer 31 and the top layer 33, and the mirror layer 21 is plated on the upper surface of the top layer 33;
   S2: the part of the top layer 33 without the cantilever beam 22 is etched from top to bottom to the oxide layer 32 to form an upper cavity, and the top end of the cantilever beam 22 is etched to form a spring-shaped groove parallel to the mirror layer 21, making the cantilever beam 22 form the required thickness;
   S3: the base layer 31 is etched from bottom to top to the oxide layer 32 to form a lower cavity;
   S4: the oxide layer 32 is etched to make the upper cavity and the lower cavity communicated to form a cavity 11; and
   S5: the etched SOI wafer is packed to form a contact-type vibration photon sensor using the Doppler effect.

The chip processing techniques in the present application include: lithography, etching, ion implantation or doping, wafer bonding process, sputtering or deposition process. Moreover, existing processes may be used unless otherwise specified.

Inspired by the foregoing ideal embodiments according to the present application, through the content of the above description, relevant workers can make various changes and modifications within the scope without departing from the technical idea of the present application. The technical scope of the present application is not limited to the contents in the description, but must be determined according to the scope of claims.

What is claimed is:

1. A contact-type vibration photon sensor using the Doppler effect, comprising an outer packaging layer (9), wherein the outer packaging layer (9) further comprises:
   a silicon-based material (1), comprising side walls (10) and a cavity (11) surrounded by the side walls (10) with a top opening; and
   a mirror body (2) being arranged inside the cavity (11), wherein a mirror layer (21) is arranged on the top of the mirror body (2), the side surface of the mirror body (2) is connected with the side walls (10) through a cantilever beam (22), and the cantilever beam (22) is spring-shaped;
   wherein the cantilever beam (22) is provided with grooves that are vertical to the mirror layer (21) and that have different opening directions, and projections of the grooves on the plane where the mirror layer (21) is located are arranged in a staggered mode or the cantilever beam (22) has grooves that are parallel to the mirror layer (21) and that have different opening directions; and
   a central axis of a connection between the cantilever beam (22) and the mirror body (2) is collinear with a central axis of the mirror body (2).

2. The contact-type vibration photon sensor using the Doppler effect according to claim 1, wherein the mirror body (2) is an axisymmetric cylinder with at least two parallel sides.

3. The contact-type vibration photon sensor using the Doppler effect according to claim 2, wherein when the mirror body (2) is in the shape of a cube, two opposite sides are connected to the side walls (10) through cantilever beams (22), or four sides are all connected to the side walls (10) through the cantilever beam (22).

4. A manufacturing method for a contact-type vibration photon sensor using the Doppler effect, manufacturing the photon sensor described in claim 1, comprising the following steps:
- S1: taking an SOI wafer, the SOI wafer comprises a base layer (31), a top layer (33) and an oxide layer (32) between the base layer (31) and the top layer (33), and the mirror layer (21) is plated on the upper surface of the top layer (33);
- S2: etching the part of the top layer (33) without the cantilever beam (22) from top to bottom to the oxide layer (32) to form an upper cavity, and etching the top end of the cantilever beam (22) to form a spring-shaped groove with a middle opening upward;
- S3: etching the base layer (31) from bottom to top to the oxide layer (32) to form a lower cavity;
- S4: etching the oxide layer (32) to make the upper cavity and the lower cavity communicated to form a cavity (11);
- S5: etching and thinning the cantilever beam (22) from bottom to top to form a spring-shaped groove with a middle opening upward; and
- S6: packing the etched SOI wafer to form a contact-type vibration photon sensor using the Doppler effect.

5. The manufacturing method according to claim 4, wherein after Step S5, a bottom silicon-based material (34) is used and bonded to the bottom of the base layer (31) by means of bonding to close the opening at the bottom of the base layer (31).

6. The manufacturing method according to claim 5, wherein the silicon-based material (34) is bonded to the bottom of the base layer (31) by means of bonding with BCB adhesive.

7. A manufacturing method for a contact-type vibration photon sensor using the Doppler effect, manufacturing the photon sensor described in claim 1, comprising the following steps:
- S1: taking an SOI wafer, the SOI wafer comprises a base layer (31), a top layer (33) and an oxide layer (32) between the base layer (31) and the top layer (33), and a mirror layer (21) plated on the upper surface of the top layer (33);
- S2: etching the part of the top layer (33) without the cantilever beam (22) from top to bottom to the oxide layer (32) to form an upper cavity, etching the top end of the cantilever beam (22) to form a spring-shaped groove parallel to the mirror layer (21), and making the cantilever beam (22) form the required thickness;
- S3: etching the base layer (31) from bottom to top to the oxide layer (32) to form a lower cavity;
- S4: etching the oxide layer (32) to make the upper cavity and the lower cavity communicated to form a cavity (11); and
- S5: packing the etched SOI wafer to form a contact-type vibration photon sensor using the Doppler effect.

\* \* \* \* \*